United States Patent

Kern et al.

[11] Patent Number: 5,902,416
[45] Date of Patent: May 11, 1999

[54] ELEMENT OF A PHOTOVOLTAIC SOLAR CELL AND A PROCESS FOR THE PRODUCTION THEREOF AS WELL AS THE ARRANGEMENT THEREOF IN A SOLAR CELL

[75] Inventors: Ralf M. Kern, Icking; Helmut Hoegl, Munich, both of Germany

[73] Assignee: Twin Solar-Technik Entwicklungs-GmbH, Dresden, Germany

[21] Appl. No.: 08/296,770

[22] Filed: Aug. 26, 1994

[30] Foreign Application Priority Data

Aug. 27, 1993 [DE] Germany .............................. 43 28 868
Oct. 28, 1993 [DE] Germany .............................. 43 36 825

[51] Int. Cl.$^6$ ...................... H01L 31/05; H01L 31/06; H01L 31/18
[52] U.S. Cl. .................. 136/244; 136/255; 136/256; 136/258; 427/74; 437/2; 437/4; 437/5; 204/471; 205/138; 205/157; 205/170; 205/915
[58] Field of Search ................... 136/244, 255, 136/256, 258 PC; 427/74–76; 437/2–5; 205/138, 157, 170, 918, 915; 204/471

[56] References Cited

U.S. PATENT DOCUMENTS

| | | | |
|---|---|---|---|
| 3,134,906 | 5/1964 | Henker | 136/246 |
| 3,969,163 | 7/1976 | Wakefield | 437/4 |
| 3,984,256 | 10/1976 | Fletcher et al. | 136/244 |
| 4,564,398 | 1/1986 | Kaufman | 148/282 |
| 4,642,140 | 2/1987 | Noufi et al. | 148/270 |
| 4,913,744 | 4/1990 | Hoegl et al. | 136/244 |

FOREIGN PATENT DOCUMENTS

| | | | |
|---|---|---|---|
| 2327643 | 5/1977 | France | 136/255 |
| 2386359 | 12/1978 | France | 136/258 PC |
| 59-125670 | 7/1984 | Japan | 136/255 |
| 59-144177 | 8/1984 | Japan | 136/244 |

*Primary Examiner*—Aaron Weisstuch
*Attorney, Agent, or Firm*—Kirkpatrick & Lockhart LLP

[57] ABSTRACT

The invention relates to an element, and a method for making the element, of a photovoltaic solar cell with an elongated, rod-like, wire-like, thread-like, or band-like electrode, which is provided on its surface with at least one photovoltaically active coating and is characterized in that the electrode consists of an electrically conductive material, in particular of impure silicon having a poly-crystalline, or a mono-crystalline structure and the coating consists of a mono-crystalline or poly-crystalline photovoltaically active material on the surface of the electrode, said material preferably being silicon having a certain doping (p- or n-doping), which, for instance, is applied continuously by means of a drawing plate or die.

23 Claims, 3 Drawing Sheets

ELEMENT OF A PHOTOVOLTAIC SOLAR CELL AND A PROCESS FOR THE PRODUCTION THEREOF AS WELL AS THE ARRANGEMENT THEREOF IN A SOLAR CELL

BACKGROUND OF THE INVENTION

The invention relates to an element of a photovoltaic solar cell having at least one electrode with an elongated, rod-like, wire-like, thread-like, or band-like configuration, which electrode is provided on its surface with at least one photovoltaically active coating, and to a process for the production thereof as well as to the arrangement thereof in a photovoltaic solar cell.

It is an object of the invention to create an element for a photovoltaic solar cell which provides for lower production costs and a higher level of efficiency, and to create a solar cell improved accordingly.

SUMMARY OF THE INVENTION

The invention is based on the fact that the electrode consists of an electrically conductive material, e.g. of metal, in particular of impure silicon having a multi-crystalline or poly-crystalline structure, preferably mono-crystalline structure and that the coating consists of a mono-crystalline or multi-crystalline photovoltaically active material on the surface of the electrode, said material preferably being silicon having a certain doping (p- or n-doping).

In a preferred embodiment the electrode conducting the current as well as the coating thereof consist of silicon, however, with a different composition, i.e. the electrode being composed of impure silicon which conducts the current well and the coating being composed of silicon as pure as possible, however, doped in an appropriate manner for achieving an optimum of photovoltaic efficiency.

In principle, one single coating on a silicon electrode would be sufficient, wherein the regions (p- and n) respectively formed within the coating and within the electrode have the opposite conductivity type dopants and provide for the photovoltaic junction field, whereas excess charge carriers, i.e. freely movable charge carriers additionally provided in the electrode as compared to the coating, provide for the improved electric conductivity of the Si-electrode.

Accordingly, with an adequate composition of the silicon, the marginal area of the electrode may be provided with a positive or negative conductivity type and the coating may be doped in an opposite manner (p- or n), respectively.

When using silicon as a material for the electrodes the structure of the electrodes can be multi-crystalline, such that the coating due to an epitactic effect can have a granular crystalline, or in particular a mono-crystalline structure.

Analogous effects can also be achieved with other materials.

Further objects, features and advantages of the present invention will become apparent from the following description of preferred embodiments thereof.

BRIEF DESCRIPTION OF THE DRAWINGS 1–9

DETAILED DESCRIPTION OF THE PREFERRED EMBODIMENTS

Figure 2:
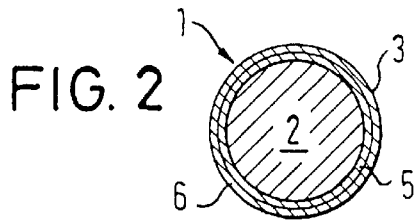
FIG. 2 is a radial cross-sectional view of a photovoltaic element having two photovoltaically-active coatings.
Figure 1:
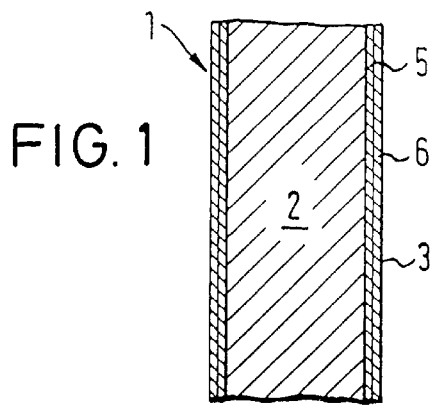
FIG. 1 is a longitudinal cross-sectional view of a photovoltaic element having two photovoltaically-active coatings.

According to FIGS. 1 and 2, in a longitudinal and in a cross-sectional view, a photovoltaic element 1 comprising an elongated, e.g. wire-like or band-like electrode 2 drawn or formed of silicon is provided with a photovoltaically active coating 3, which may consist of a radial inner layer 5 and an outer layer 6 arranged thereupon, said layers 5 and 6 being doped in an opposite manner (p- and n).

Figure 4:
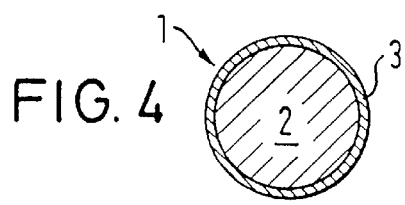
FIG. 4 is a radial cross-sectional view of a photovoltaic element having a photovoltaically-active coating.
Figure 3:
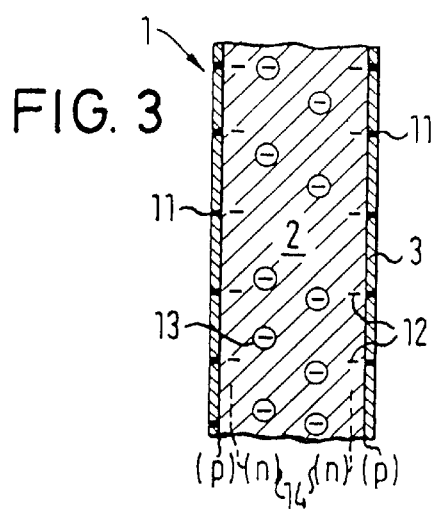
FIG. 3 is a longitudinal cross-sectional view of a photovoltaic element having an inner photovoltaically-active doped layer, formed on the outer surface of the electrode and shown in phantom, and an outer photovoltaically-active coating.

In FIGS. 3 and 4, in an analogous manner, an electrode 2 is illustrated, however, being provided with only one coating 3 consisting of only a single layer having a certain doping (p- or n-, here p). On both sides of the boundary of the coating on the surface of the electrode there may occur a drift field separation of electrons 12 (−) and "holes" 11 (+), while excess electrons 13 provide for an increase of the electric conductivity of the silicon electrode 2.

For instance, by means of a diffusion or other process, a doped layer 14 may be formed in the outer surface of the electrode 2, in particular after a previous cleaning or treatment of the surface of the electrode material. When two elements 1 formed of coated electrodes 2 are joined together according to FIGS. 5 and 6, a photovoltaic solar cell is formed between the electrodes 2 or as an arrangement of two electrodes, i.e. of electrode 2 and counterelectrode 7 having oppositely doped coating surfaces, respectively, such that the current flows radially through the coatings 3 between the electrodes 2 and 7.

Figure 5:
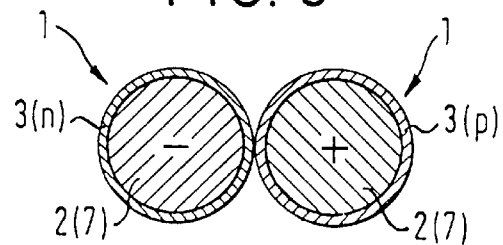
FIG. 5 is a radial cross-sectional view of two photovoltaic elements joined together.
Figure 6:
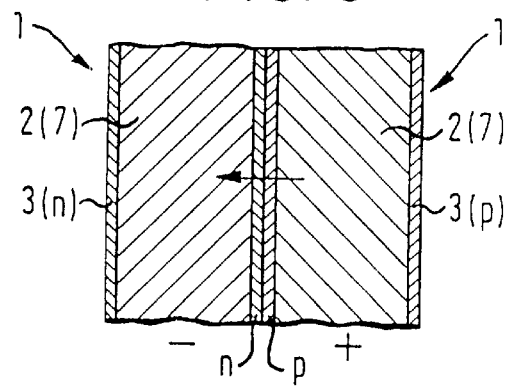
FIG. 6 is a longitudinal cross-sectional view of two photovoltaic elements joined together.
Figure 7:
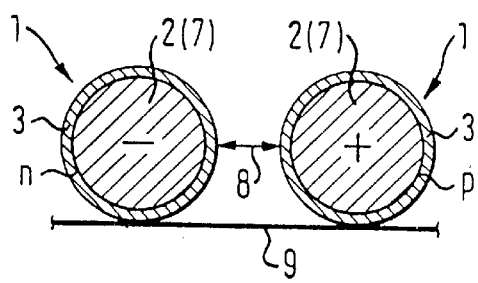
FIG. 7 is a radial cross-sectional view of two oppositely doped, spaced apart, photovoltaic elements connected to a metallic plate.

According to FIG. 7 two elements 1, with oppositely doped surface coatings 3, may be provided, connected in an electrically conductive manner, on a metallic plate 9 (which may also be reflective) either at a distance 8 apart or adjacent to one another (analogous to FIGS. 5 and 6).

Figure 8:
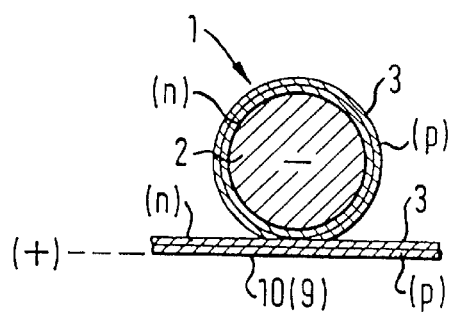
FIG. 8 is a radial cross-sectional view of a photovoltaic element connected to a photovoltaic plate.

According to FIG. 8, a sheet or plate 9 formed as a photovoltaic element may also be provided with a photovoltaically active coating 3 on the side facing the elements 1, said elements 1 being conductively provided on said coating 3. Thereby the photovoltaically coated surface 10 on said plate 9 acts as a counterelectrode, while the elements 1 having a coated surface doped opposite to the surface of the photovoltaic coating are conductively connected at a lateral distance 8 (analogous to FIG. 7) on the surface of the photovoltaic coating.

Figure 9:
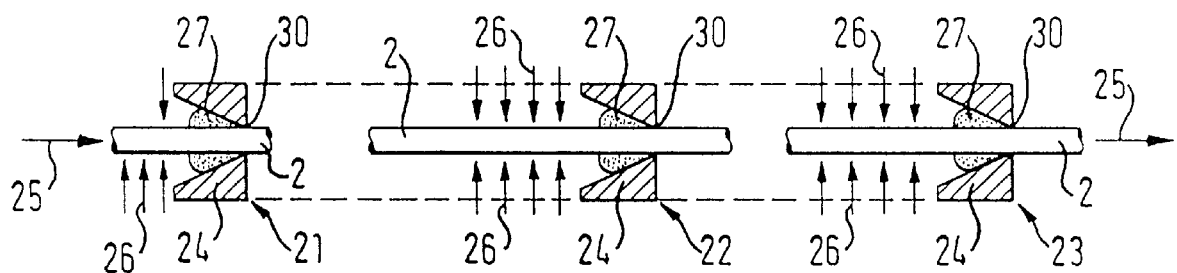
FIG. 9 shows a method of applying a coating material to an element by means of drawing the element through a hole.

FIG. 9 shows a method of application where the coating material is applied by means of continuously drawing through a round hole 30 e.g. an electrode wire 2 consisting of different materials such as metals (e.g. copper, aluminum, tungsten, V2A steel (a nickel-chromium steel)), onto which in the moving direction 25 in front of the drawing plates 24 the coating material 27 is applied 26 which material 27 may also respectively accumulate in front of each drawing plate or die of the individual drawing stations 21–23. Such a drawing process is known in general for the production of ordinary metal wire whereby the diameter and cross section is reduced.

With this process the structure and the cross section of the electrode wire itself can be influenced. At any rate, under the pressure ratios or rates within the drawing plate or die or hole 30 a structure formed in a controlled manner and a connection or joining of several layers, free from impurities and as close together as possible, can be achieved on the surface of the electrode, with an optimum uniformity and evenness and a thin film thickness of the layer.

Under the pressure rate or grade within the drawing plate or die, chemical changes, (e.g. oxidation of copper) of the electrode surface or of the materials applied, and also e.g. inter-crystalline compounds, are possible.

The coating of the elongated electrode having a wire-like, rod-like, thread-like, or band-like configuration can be provided in the most simple manner by means of liquid phase epitaxy (LPE), wherein particularly a macro-crystalline, preferably a mono-crystalline, silicon coating is formed in the following manner:

For p-silicon layers, silicon, together with the required dopant, is dissolved in liquid indium or gallium or bismuth or alloys thereof, preferably saturated or oversaturated, and, in a reduced atmosphere, such as for instance in hydrogen gas, the surface to be coated is incorporated or placed in the melt in such a manner that when the temperature on the surface of the wire is reduced, the silicon is applied together with the dopant, in largely mono-crystalline form with the required dopant concentration.

For an n-doped coating an AsIn or indium melt is preferred as a solvent for the silicon and the dopant.

The temperature applied for the growth of crystals may be in a range of between 250° and 940° C., with a rate of cooling of 5° to 16° C./h. The orientation of the crystals of the substrate may be e.g. [100] or [111].

For the segregation or application of gallium arsenide layers, in an analogous manner, Ga, GaGe or GaSi-alloys are used as solvents, whereby the range of temperature of the layer growth is from 300° to 750° C. with an identical or similar cooling speed and the preferred orientation of the substrate is [100] or [111]. In this way also, several layers may be applied onto the wire surface one above the other.

According to the invention, the surface of the substrate may first be changed chemically or doped to form a first photovoltaic layer (p or n), before the silicon layers are applied in the above-mentioned manner—perhaps after cleaning the surface e.g. through a drawing plate or a die. Thereby also profiled or textured surfaces may be formed, for instance wire-like or elongated profiles with longitudinally extending grooves.

With the process according to the invention, layers having a thickness of between $0.5\mu$ and $100\mu$ can be applied. According to the process of the invention, the surface of a wire, e.g. of a silicon wire, is cleaned first (also e.g. by means of drawing through a drawing plate or die or by means of etching) and, subsequently the wire is drawn through coating baths arranged one behind the other, in which—at a selected speed and duration of reaction or immersion—the silicon coating is provided with a selective layer thickness and succession of n- and p-layers—depending on the sequence of the coating baths. The shaped wire coated in this manner can subsequently be solidified by drawing same through a drawing plate or die.

A particularly advantageous sequence of layers consists of a silicon coating on a wire-like or other elongated substrate (also of a C-fiber), the surface thereof being coated with chrome, zinc, or cadmium, whereby at the same time a radially inner reflection layer is formed which provides a higher level of photovoltaic efficiency.

Similar photovoltaic coatings can be achieved with a molecular beam epitaxy process.

Analogous to the above-described and preferred embodiment, the material of the elongated substrate may be treated chemically at the same time, from the exterior into the surface thereof, such that the outer cross sectional area thereof is changed—depending on the material of the electrode—in the sense of a photovoltaically active marginal area or a marginal area favoring the photovoltaic effect thereof.

As an example, zinc oxide is useful with an electrode consisting of zinc, or copper oxide (CuO) or copper dioxide ($CuO_2$) with an electrode consisting of copper, and magnesium oxide for an electrode consisting of magnesium. The metallic electrode material can also be alloyed or structurally shaped in such a manner that the chemical treatment thereof results in a photovoltaically active mixed compound, possibly at the same time combined with a dopant.

With respect to silicon as an electrode material, in the case of coating with silicon in a manner similar to MIS-cells, the electrode may be provided with a thin $SiO_2$-layer between the surface of the electrode and the photovoltaic material on the circumference in order to permit tunnelling of the electrons to the electrode.

If all the thread-like elongated electrodes as described in the foregoing are provided, respectively, with at least one photovoltaically active p-doped surface layer and above same an n-doped surface layer—or vice versa—they may also be provided in an identical arrangement, whereby all the electrodes are provided with the same polarity (i.e. p+ or n–) on their outer surfaces and they can also be arranged adjacent to one another, next to one another, or together with one another on an electrically conductive substrate as a counterelectrode, e.g. as an area or plane, and they may be in direct electrically conductive contact therewith. In this connection, all the electrode wires form one (+ or –) pole, and the electrically conductive substrate is the counterelectrode for all the electrode wires. Electrically conductive adhesive can be used for contacting or joining all the electrode wires and/or for fixing same on the substrate surface.

The adhesive can be applied by means of the drawing process in a simultaneous combined processing treatment, in one line, similar to and subsequent to the one of FIG. 9, in order to provide for a thickness as thin as possible.

What we claim is:

1. An element of a photovoltaic solar cell, comprising:
    an elongated silicon electrode having a surface and having a dopant concentration sufficient to establish electrical conductivity;
    a photovoltaically active coating consisting of a photovoltaically active material formed at least in part from a portion of the surface of said electrode, said photovoltaically active material containing a conductivity type dopant.

2. The element of a photovoltaic solar cell according to claim 1, wherein:
    the photovoltaically-active coating consists of an inner coaxial layer and an outer coaxial layer, wherein said outer layer comprises a first conductivity type and said inner layer comprises a second, opposite conductivity type.

3. The element of a photovoltaic solar cell according to claim 2, wherein:

at least the outer layer of the photovoltaically active coating is provided with a crystalline structure selected from the group consisting of poly-crystalline, micro-crystalline, and amorphous structure.

4. A solar cell arrangement with at least one element according to claim 3, further comprising:

an elongated counterelectrode with at least one photovoltaically active coating and having a surface, said counterelectrode having a doped coating on its surface which is opposite to the conductivity type of the outer layer of the electrode and which is conductively connected therewith via said surface.

5. The solar cell arrangement according to claim 4, wherein the doped coating of the electrode and the doped coating on the counterelectrode are arranged in an electrically conductive manner adjacent to one another and in electrically conductive contact with each other.

6. The solar cell arrangement according to claim 4, wherein the electrode and the counterelectrode are arranged in parallel with each other and at a distance to one another on an electrically conducting plane, plate or sheet and the outer layer of the doped coating of the electrode and the coating of the counterelectrode are conductively connected with each other via said plane, plate or sheet.

7. The solar cell arrangement according to claim 6, wherein said plane, plate or sheet is provided with at least one photovoltaically active coating, a surface, and a conductivity type opposite to one of the coatings of the electrode, the coating of the electrode and the coating of the counterelectrode being arranged in an electrically conductive manner via the surface of the plane, plate or sheet.

8. The solar cell arrangement according to any one of claims 4 to 7, further comprising an electrically conductive adhesive used for connecting the coating of the electrode with the coating of the counterelectrode.

9. The solar cell arrangement according to any one of claims 4 to 7, wherein the coating of the electrode and the coating of the counterelectrode are welded together by a welding means selected from the group consisting of electron-beam welding means and laser welding means.

10. The solar cell arrangement according to any one of claims 4 to 7, wherein at least one of the photovoltaically active coatings of the electrode is integral with the surface of the electrode.

11. The solar cell arrangement according to claims 6 or 7, wherein the surface of the electrically conductive plane, plate or sheet is provided with a reflective layer.

12. A process for the production of an element for a photovoltaic cell, comprising the steps of:

forming an elongated, electrically conductive electrode;

moving the electrode through a source of dopant containing photovoltaic coating material in order to achieve a dopant containing photovoltaic coating thereon selected from the group consisting of poly-crystalline coating and monocrystalline coating; and drawing the electrode through a drawing plate or a die to solidify the coating.

13. The process for the production of an element for a photovoltaic cell according to claim 12, wherein the coating is applied by means of an electron-beam process.

14. The process for the production of an element for a photovoltaic cell according to claim 12, wherein the coating is applied electrolytically.

15. The process for the production of an element for photovoltaic cell according to claim 12, wherein the coating is applied by a vapor phase process.

16. The process for the production of an element for a photovoltaic cell according to claim 12, wherein the coating is applied in an electro-phoretic manner.

17. The process for the production of an element for a photovoltaic cell, according to claim 12, wherein the material of the surface of the electrode is chemically transformed.

18. The process according to claim 17, wherein the dopant containing coating material is applied in a continuous process with several application and drawing stations.

19. The process according to claim 17, wherein several photovoltaic coatings are applied successively.

20. The process for the production of an element for a photovoltaic cell according to claim 12, wherein:

the coating material is provided by a coating means selected from the group consisting of sputtering means, spraying means, laser-coating means, electrostatic coating means, electron-beam coating means, evaporation means, and sintering means; and the coating material is incorporated with a surface of the electrode by drawing through means selected from the group consisting of drawing-plates and dies.

21. The process according to claim 20, wherein several photovoltaic coatings are applied successively.

22. The process according to any one of claims 12 to 21, wherein the application of the dopant containing coating material is made with a simultaneous application of micro waves.

23. An element of a photovoltaic solar cell, comprising:

an elongated silicon electrode having a surface and having a dopant concentration sufficient to establish electrical conductivity, wherein said electrode is selected from the group consisting of multi-crystalline material and mono-crystalline material; and at least one coating formed at least in part from a portion of the surface of said electrode and comprising photovoltaically active material, wherein said photovoltaically active material is selected from the group consisting of mono-crystalline material and poly-crystalline material.

* * * * *